United States Patent
Chang et al.

(10) Patent No.: US 9,023,699 B2
(45) Date of Patent: May 5, 2015

(54) RESISTIVE RANDOM ACCESS MEMORY (RRAM) STRUCTURE AND METHOD OF MAKING THE RRAM STRUCTURE

(71) Applicant: Taiwan Semiconductor Manufacturing Company, Ltd., Hsinchu (TW)

(72) Inventors: Chih-Yang Chang, Yuanlin Township (TW); Wen-Ting Chu, Kaohsiung (TW); Kuo-Chi Tu, Hsinchu (TW); Yu-Wen Liao, New Taipei (TW); Hsia-Wei Chen, Taipei (TW); Chin-Chieh Yang, New Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 16 days.

(21) Appl. No.: 13/722,345

(22) Filed: Dec. 20, 2012

(65) Prior Publication Data
US 2014/0175365 A1    Jun. 26, 2014

(51) Int. Cl.
*H01L 27/108* (2006.01)
*H01L 45/00* (2006.01)
*H01L 27/24* (2006.01)

(52) U.S. Cl.
CPC .............. *H01L 45/145* (2013.01); *H01L 45/16* (2013.01); *H01L 45/04* (2013.01); *H01L 45/1233* (2013.01); *H01L 45/146* (2013.01); *H01L 45/1675* (2013.01); *H01L 27/2436* (2013.01)

(58) Field of Classification Search
CPC .. H01L 29/435; H01L 29/4983; H01L 27/108
USPC ................... 257/4, 2; 438/382, 253, 396, 785; 365/148, 360, 8, 46, 100, 158
See application file for complete search history.

(56) References Cited

U.S. PATENT DOCUMENTS

| | | | |
|---|---|---|---|
| 6,677,637 B2 | 1/2004 | Bernstein et al. |
| 6,709,942 B2 | 3/2004 | Pan et al. |
| 6,737,728 B1 | 5/2004 | Block et al. |
| 6,781,185 B2 | 8/2004 | Chen et al. |
| 6,803,641 B2 | 10/2004 | Papa Rao et al. |
| 6,849,891 B1 | 2/2005 | Hsu et al. |
| 6,936,881 B2 | 8/2005 | Yeo et al. |
| 6,937,457 B2 | 8/2005 | Shih et al. |
| 6,940,705 B2 | 9/2005 | Yeo et al. |

(Continued)

FOREIGN PATENT DOCUMENTS

| | | |
|---|---|---|
| KR | 10-0544085 | 1/2006 |
| KR | 101171874 | 8/2012 |

OTHER PUBLICATIONS

Wong, H.-S. Philip, et al., "Metal-Oxide RRAM", vol. 100, No. 6, Jun. 2012, Proceedings of the IEEE, pp. 1951-1970.

(Continued)

*Primary Examiner* — Davienne Monbleau
*Assistant Examiner* — Damon Hillman
(74) *Attorney, Agent, or Firm* — Lowe Hauptman & Ham, LLP

(57) ABSTRACT

The present disclosure provides a resistive random access memory (RRAM) cell. The RRAM cell includes a transistor, a bottom electrode adjacent to a drain region of the transistor and coplanar with the gate, a resistive material layer on the bottom electrode, a top electrode on the resistive material layer, and a conductive material connecting the bottom electrode to the drain region.

20 Claims, 16 Drawing Sheets

(56) References Cited

U.S. PATENT DOCUMENTS

| | | |
|---|---|---|
| 7,195,970 B2 | 3/2007 | Tu et al. |
| 7,407,858 B2 | 8/2008 | Li et al. |
| 7,557,399 B2 | 7/2009 | Tu et al. |
| 7,952,163 B2 * | 5/2011 | Baek et al. .................. 257/536 |
| 8,000,128 B2 | 8/2011 | Li et al. |
| 8,009,454 B2 | 8/2011 | Lee et al. |
| 8,148,765 B2 * | 4/2012 | Shim et al. .................. 257/310 |
| 8,541,819 B1 * | 9/2013 | Or-Bach et al. ............. 257/211 |
| 2006/0214213 A1 * | 9/2006 | Bariecki et al. ............. 257/310 |
| 2010/0110758 A1 | 5/2010 | Li et al. |
| 2011/0220862 A1 | 9/2011 | Arita et al. |
| 2011/0291064 A1 | 12/2011 | Marsh et al. |

OTHER PUBLICATIONS

Office Action dated Apr. 15, 2014 and English translation from corresponding application No. KR 10-2013-0061662.

* cited by examiner

View A-A'

View B-B'

View A-A'

View A-A'

View B-B'

View B-B'

View B-B'

View B-B'

View B-B'

RESISTIVE RANDOM ACCESS MEMORY (RRAM) STRUCTURE AND METHOD OF MAKING THE RRAM STRUCTURE

FIELD

The disclosure relates to semiconductor devices and, more particularly, to resistive random-access memory (RRAM) device structures and layouts and methods for making the RRAM devices.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the 'form' voltage. The conduction path formation can arise from different mechanisms, including defect, metal migration, and other mechanisms. Various different dielectric materials may be used in RRAM devices. Once the filament or conduction path is formed, it may be reset, i.e. broken, resulting in high resistance or set, i.e. re-formed, resulting in lower resistance, by an appropriately applied voltage. There are various architectures to configure an array of RRAM cells. For example, a cross-point architecture include a RRAM in each cell configured between crossed a word line and a bit line. In another example, a transistor type architecture pairs a RRAM with a transistor (1T1R) in each cell and improves random access time at the expense of cell area. Further, the 1T1R architecture needs more material layers and at least three additional photomasks, therefore more processing steps and more fabrication cost.

Accordingly, improved RRAM structure and method of manufacturing continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
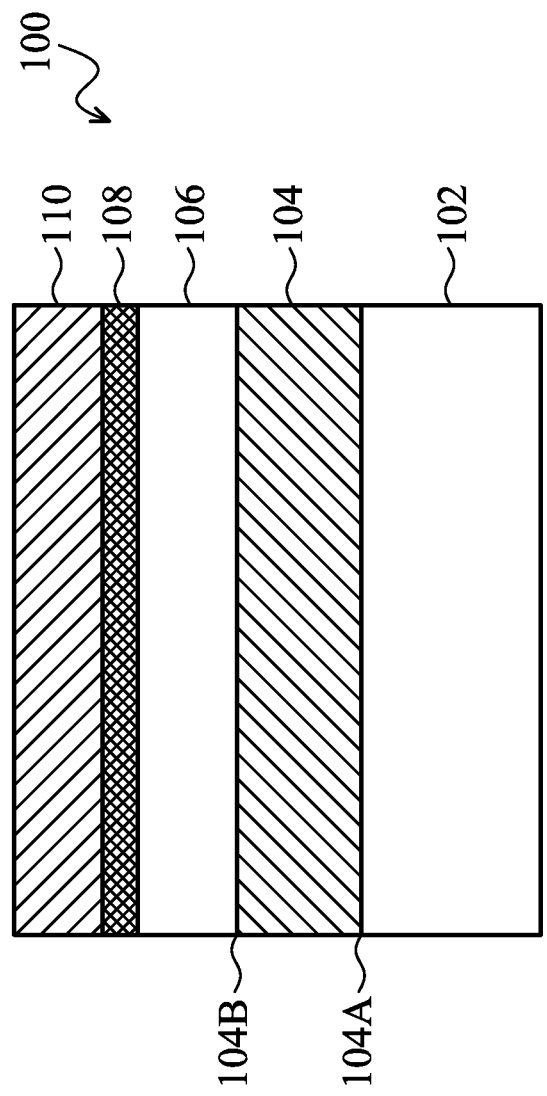
FIG. 1 is a cross sectional views of a resistive random access memory (RRAM) structure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

As discussed, a resistive random access memory (RRAM) structure includes a resistive material layer between two electrodes as shown in FIG. 1. The RRAM structure 100 includes a bottom electrode 104 over a substrate 102, a resistive material layer 106, and a top electrode 110. The RRAM structure 100 may have two or more states with different electric resistance values. Each state may represent a different digital value. The RRAM structure 100 may switch from one state to another by applying a predetermined voltage or current to the RRAM structure 100. For example, the RRAM structure 100 has a state of relatively high resistance, referred to as "a high resistance state", and a state of relatively low resistance, referred to as "a low resistance state". The RRAM structure 100 may be switched from the high resistance state to the low resistance state, or from the low resistance state to high resistance state, by applying a predetermined voltage or current.

The substrate 102 may be a substrate employed in a semiconductor process, such as a silicon substrate. The substrate 102 may be bulk substrate and may include devices or an isolation structure. FIG. 1 illustrates the substrate 102 in a plain rectangle in order to simplify the illustration, and is not limiting. There may be other shapes and sizes of substrate 102 as well as intervening layers.

In a memory bit cell having one transistor and one RRAM (1T1R) the bottom electrode 104 is electrically connected to a drain electrode of a transistor. The bottom electrode 104 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode from a bottom 104B to a top 104A may be between a range about 100-500 nm. In one embodiment, the bottom electrode includes a tantalum nitride layer and a titanium nitride layer.

A resistive material layer 106 is formed on the bottom electrode 104 and directly contacts the bottom electrode 104. The thickness of the resistive material layer 106 may be between a range about 20-100 nm. The resistive material layer may include one or more oxide of W, Ta, Ti, Ni, Co, Hf, Ru, Zr, Zn, Fe, Sn, Al, Cu, Ag, Mo, Cr. In some cases, silicon forms a composite material. In some embodiments, hafnium oxide and/or zirconium oxide is used.

A top electrode 110 is formed over the resistive material layer 106 or the optional capping layer 108. The top electrode 110 may be formed from materials such as gold (Au), platinum (Pt), ruthenium (Ru), iridium (Ir), titanium (Ti), aluminum (Al), copper (Cu), tantalum (Ta), tungsten(W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 110 may be between a range about 100-500 nm.

Figure 2:
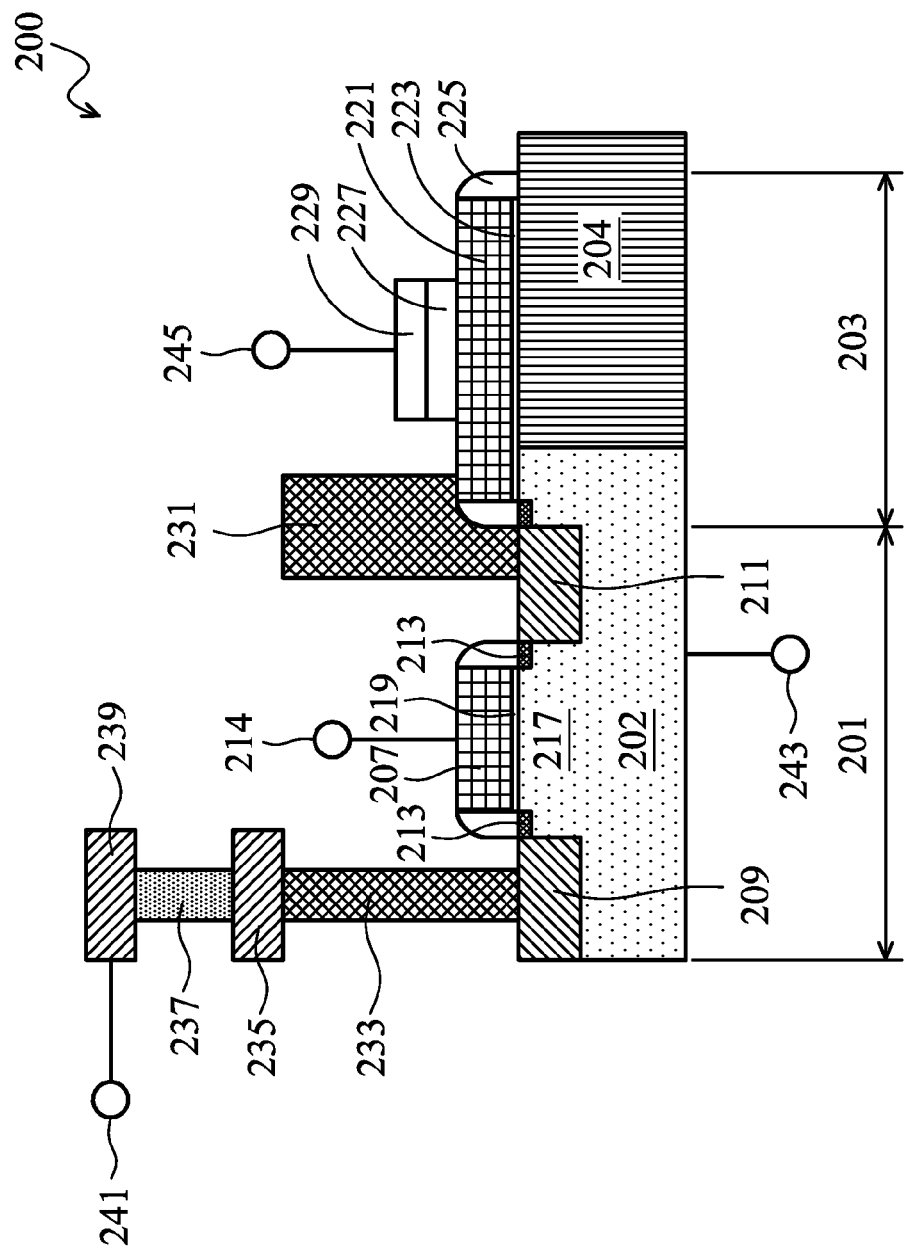
FIG. 2 is a cross sectional diagram of a memory cell in accordance with various embodiments of the present disclosure.

FIG. 2 is a cross-sectional diagram of a memory cell 200 in accordance with various embodiments of the present disclosure. The memory cell 200 includes a transistor portion 201 and an RRAM structure portion 203. The transistor portion 201 includes a gate 207, a source region 209, a drain region 211, one or more lightly-doped drain (LDD) regions 213, and a channel region 217 under the gate 207 in the substrate 202. The gate 207 may be a polysilicon gate or a high-k metal gate including a gate dielectric 219 and spacers 215. Conductive portions of the gate 207 may include one or more layers or a composite structure. In one embodiment, a polysilicon gate 207 also includes a salicided (self-aligned silicide) region at the top. In another embodiment, a high-k metal gate 207 includes a material comprising one or more of aluminum, titanium, titanium nitride, tantalum nitride, and other known metals and compounds used in a metal gate.

Next to the transistor portion 201 is the RRAM structure portion 203. As discussed in association with FIG. 1, the RRAM structure portion 203 includes a bottom electrode, a resistive material layer, and a top electrode in a stack. The bottom electrode 221 is wider than the resistive material layer 227 and top electrode 229. The bottom electrode 221 is disposed across the transistor drain region 211 from the gate stack and formed at the same time. The resistive material layer 227 and the top electrode 229 are disposed on a portion of the bottom electrode 221 away from the transistor drain region 211. As shown in FIG. 2, the resistive material layer 227 and the top electrode 229 are disposed on a middle cross-section of the bottom electrode so that portions on either side are not occupied. A portion of the bottom electrode 221 without the resistive material layer 227 and the top electrode 229 thereon is disposed proximate to the transistor drain region 211. Edges of the resistive material layer 227 and the top electrode 229 distal from the transistor drain region 211 may be aligned with the distal edge of the bottom electrode 221.

A conductive material 231 electrically connects the bottom electrode 221 and the transistor drain region 211. The conductive material 231 may be formed at the same time as the contact 233 to the transistor source region 209. When formed at the same time as the source region contact 233, the conductive material 231 is referred to as the stretch contact 231. The stretch contact 231 is formed of the same material as the source region contact 233 and in some embodiments makes no electrical connection to interconnect layers above. A first metal layer 235, a first via layer 237, and a second metal layer 239 are disposed above the source region contact 233.

The memory cell 200 is controlled through at least four electrical connections to read, write, and form the memory cell 200. These four electrical connections are shown in FIG. 2, but in a physical device may or may not appear together on a cross-section view. The four electrical connections 241, 243, 245, and 247 are shown in dotted lines. A gate contact 241 connects to the gate conductor and can be used to control a gate voltage that allows the channel region 217 to conduct. A body contact 243 is connected to the semiconductor substrate 202 and can be used to provide a ground or bias the transistor. A source line contact 245 is connected to the top electrode 229; and a bit line contact 247 is connected to the source region contact 233. In certain embodiments, the stretch contact is connected to metal interconnects and may be used to access the RRAM while bypassing the transistor.

During memory cell 'form' operation, a specified voltage is applied across the RRAM structure between the bottom electrode 221 and the top electrode 229. The voltage is provided through the transistor 201 from the bit line contact 247 across to the source line contact 245. The 'form' voltage is usually a different voltage from the voltage used to read and write the memory cell and is usually at a higher absolute value or has a different polarity. In one example, the 'form' voltage may be 3 volts or greater, or about 5 volts. During the 'form' operation, a bias may be provided via the body contact 243. In some embodiments, the 'form' voltage is provided from the stretch contact 231 while bypassing the transistor.

After the 'form' operation, one or more filament conductors are formed across the resistive material layer 227. The resistance across the resistive material layer 227 is at a low value and a high current may be passed when the transistor 201 is selected. During the write operation, the one or more filament conductors are broken by passing a voltage different from the 'form' voltage. In some embodiments, the 'write' voltage may have a different polarity than the 'form' voltage. In one example, the 'write' voltage is about 1 volt. After the one or more filaments stop conducting, the resistance across the resistive material layer 227 is at a high value, a low current or no current may be passed when the transistor 201 is selected. Subsequent write operation applies yet a different voltage that is less than the 'form' voltage to make the filament conduct again. By changing the filament conductors, a high or low resistance is stored in the memory cell that does not change when the power is removed. Either the high resistance or the low resistance may be read as a "0" or "1", respectively.

During a read operation, a 'read' voltage is applied across the RRAM structure. In some examples, the 'read' voltage is between about 0.3 volts to about 0.5 volts. The 'read' voltage is much smaller than the 'write' voltage to avoid inadvertent writing of the memory cell to a different value.

Figure 3:
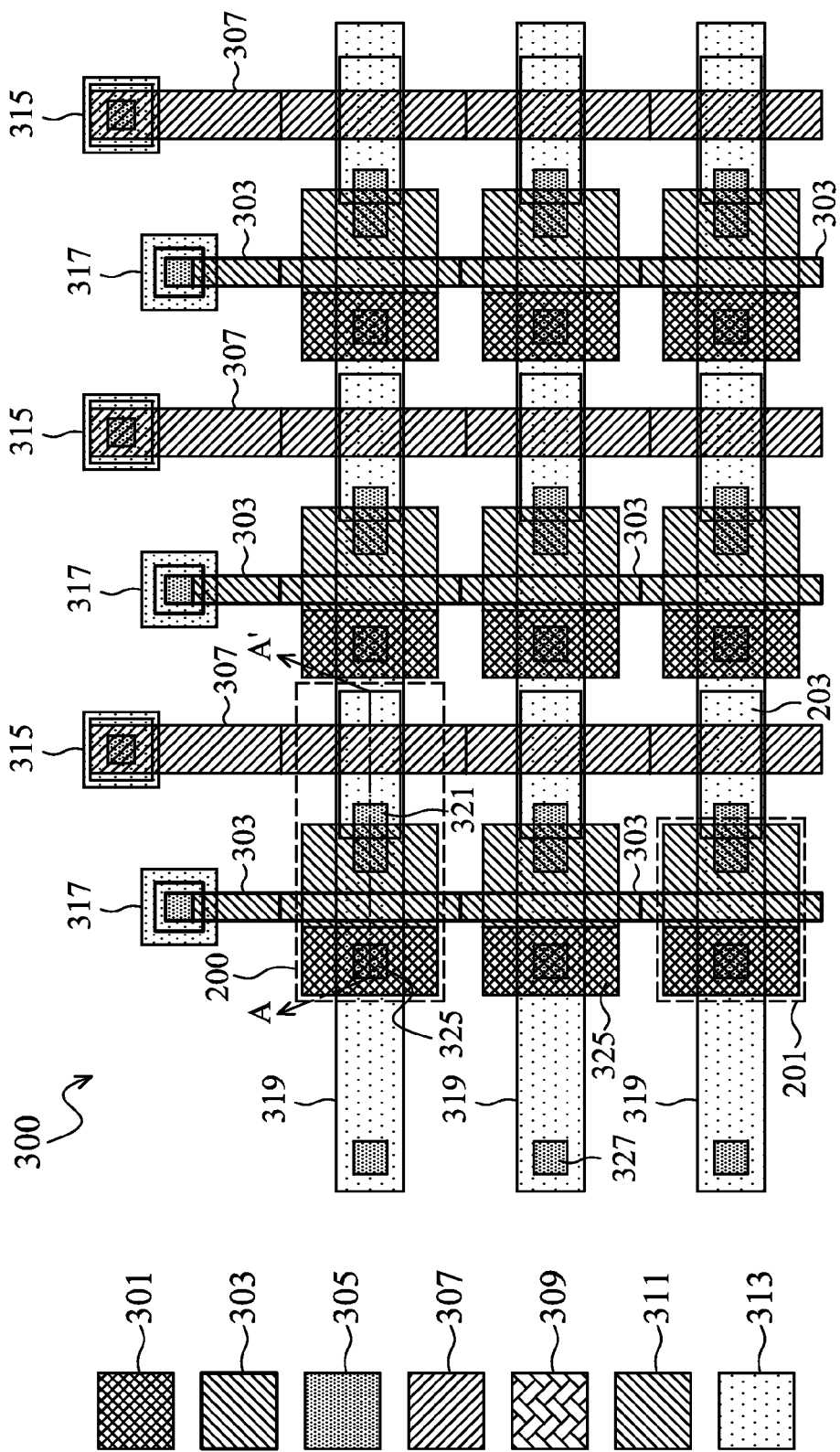
FIG. 3 is a layout diagram of a portion of a memory cell array having memory cells of FIG. 2 according to various embodiments of the present disclosure.

A plurality of memory cells each having a structure as the memory cell 200 of FIG. 2 are arranged as an array of memory cells in a logic device. The memory cell array is organized into bit lines and word lines. The bit line contact 247 is connected to the bit line of the memory cell array and the gate contact 241 is connected to the word line of the memory cell array. FIG. 3 is a layout diagram of a portion of a memory cell array using the memory cell 200 of FIG. 2. Sectional view line A-A' across the memory cell 200 of FIG. 3 corresponds to the cross-sectional view of FIG. 2.

The layout diagram includes shapes shown with different borders and shading to differentiate their composition. When shapes overlap one another in the layout, overlying and underlying borders and shadings are shown without indicating order of overlap. The cross-sectional views may be used find the vertical positioning of the various features. Some shapes are used in different features with varying functionality. For example, a shape indicating a contact may be used in several features for contacting different portions of the memory cell and connecting different portions of the memory cell array. A legend for the shapes is provided. Shading 301 corresponds to vias. Shading 305 corresponds to the first metal layer M1, and Shading 313 corresponds to the second metal layer M2. Vias 301 are typically used between metal layers such as the first metal layer M1 and the second metal layer M2. Shading 303 corresponds to a gate structure, which may be a polysilicon gate stack or a high-k metal gate stack. Shading 307 corresponds to a top electrode of the RRAM structure. Shading 309 is a contact used for contacting different portions of the memory cell and optionally connecting to different portions of the memory cell array. Shading 311 defines the active area of the transistor in the memory cell.

The portion of a memory cell array 300 in FIG. 3 includes nine memory cells 200 arranged in a three by three matrix. Each memory cell 200 includes a transistor 201 and an RRAM 203. Memory cells 200 in a column shares the gate structure 303 with a common word line pick-up 317 at one end of the gate structure 303. Memory cells 200 in a column also shares the top electrode 307 of the RRAM structure with a top electrode pick up 315 at one end of the top electrode 307. Memory cells 200 in a row shares the bit line 319 at the second metal layer 313. The memory cell array 300 includes contacts 309 at four different types of places. In each memory cell 200 a contact 309 is used as a stretch contact 321 between the bottom electrode and the drain region of transistor 201 but is not connected to a metal layer over the stretch contact 321. In each memory cell 200 a contact 309 is used to contact the source region of the transistor 201 and connect to the bit line 319 at the M2 313 level through a M1 feature 325 and vias 327. For each column of memory cells 200, a contact 309 is used to connect the gate structure 303 to the word line pick up 317 and a contact 309 is used to connect the top electrode 307 to the top electrode pick up 315.

Figure 4:
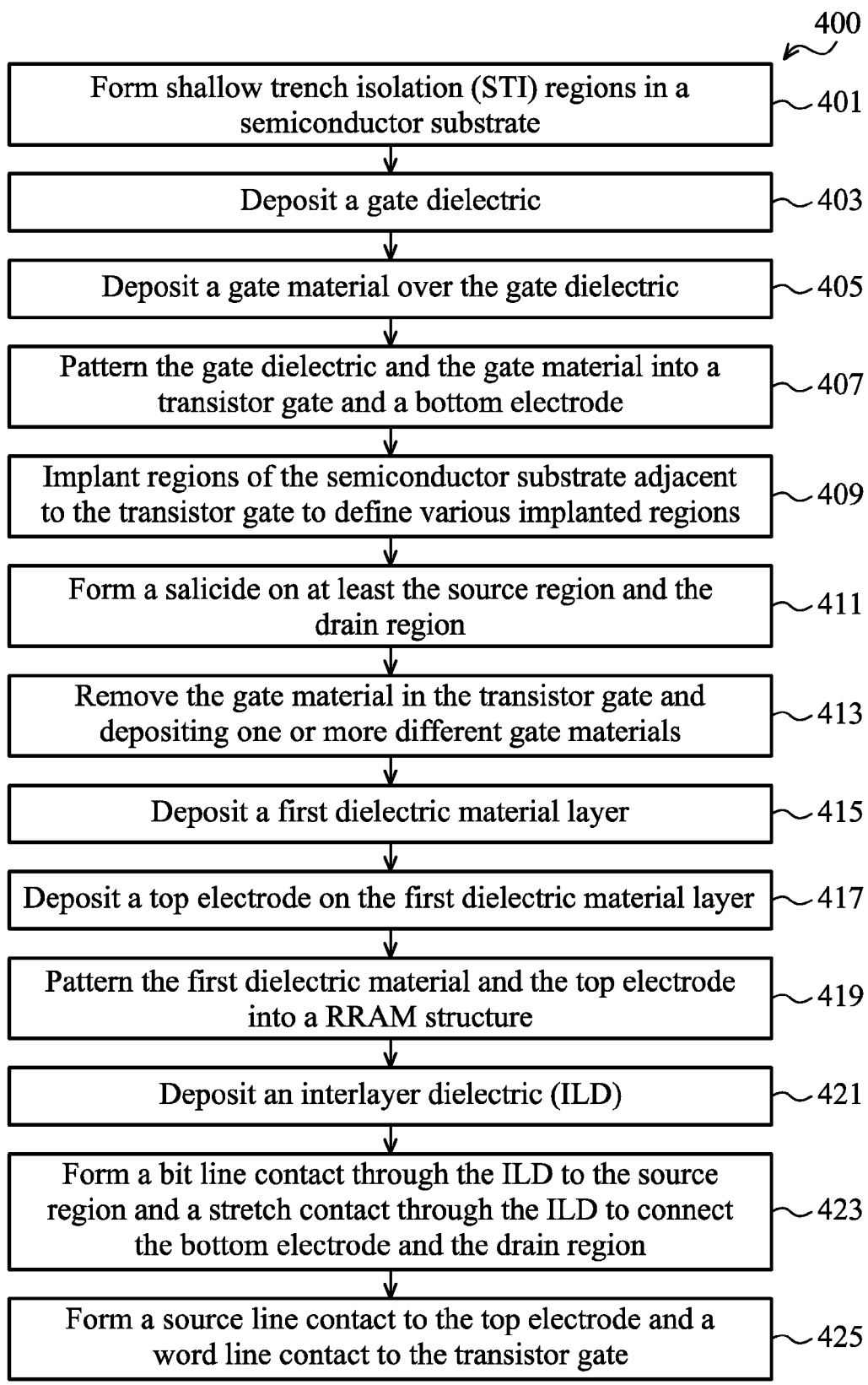
FIG. 4 is a flowchart of a method of making a memory device constructed according to aspects of the present disclosure in various embodiments.

FIG. 4 is a flowchart of a method 400 for making a memory device according to aspects of the present disclosure in various embodiments. The method 400 of FIG. 4 is adaptable to different transistor types (such as polysilicon gate and high-k metal gate) and fabrication processes (such as gate first or gate last). Various operations of the method 400 are discussed in association with cross-sectional diagrams 5A-9A and 5B-9B as well as layout diagrams 5C, 7C, and 9C. Some alternate embodiments are discussed in association with cross-section diagrams 10A-10E and 11A-11E.

In operation 401 of method 400, shallow trench isolation (STI) regions are formed in a semiconductor substrate. The substrate may be a semiconductor substrate. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. STI regions are formed by removing portions of the semiconductor substrate to form trenches in the semiconductor substrate and filling the trenches with a dielectric material. The dielectric material may be silicon oxide, silicon nitride, silicon oxynitride, carbon doped silicon oxide or nitride, or other known STI materials. The STI regions separate active regions of transistors from each other and provide isolation between semiconductor devices formed in the substrate.

In operation 403, a gate dielectric is deposited over the wafer having STI regions and active regions. A gate dielectric may be silicon oxide, for example, a thermally grown silicon oxide, or a high-k dielectric such as a metal oxide. Example high-k dielectrics include HfO2, $Ta_2O_5$, $Al_2O_3$, $TiO_2$, TiN, $ZrO_2$, SnO, or $SnO_2$. The gate dielectric may be deposited using a chemical vapor deposition (CVD) process, including varieties of the CVD process such as atomic layer deposition (ALD), plasma enhanced (PE) CVD, high-density plasma (HDP) CVD, or the gate dielectric may be grown on the wafer, for example, by using a thermal oxide process.

In operation 405, a gate material is deposited or formed over the gate dielectric. According to various embodiments, the gate material is polysilicon. Polysilicon is deposited over the gate dielectric material to form a gate stack. In operation 407, the gate dielectric and the gate material is patterned into a transistor gate and a bottom electrode. The patterning of the transistor gate and bottom electrode is performed by using one photomask having both the transistor gate and bottom electrode. Thus in this operation, no additional photomask is used as compared to the logic fabrication process. The patterning of the transistor gate and bottom electrode includes depositing a photoresist on the wafer, exposing a portion of the photoresist through the photomask to a light radiation, and developing the photoresist to remove a portion. A remaining portion of the photoresist then acts as an etch mask for the patterning etch where unwanted portions of the gate material and the gate dielectric is removed.

Figure 5A:
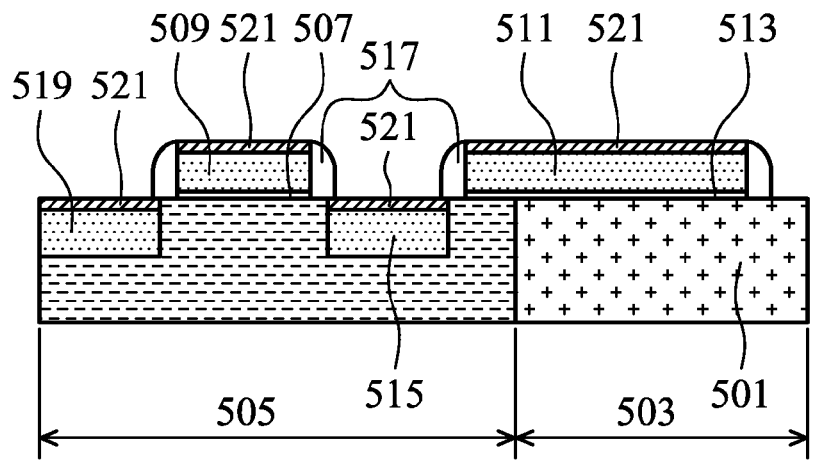
FIGS. 5A, 5B, 6A, 6B, 7A, 7B, 8A, 8B, 9A, and 9B are cross sectional diagrams of a partially fabricated memory cell in accordance with various embodiments of the present disclosure.
Figure 5B:
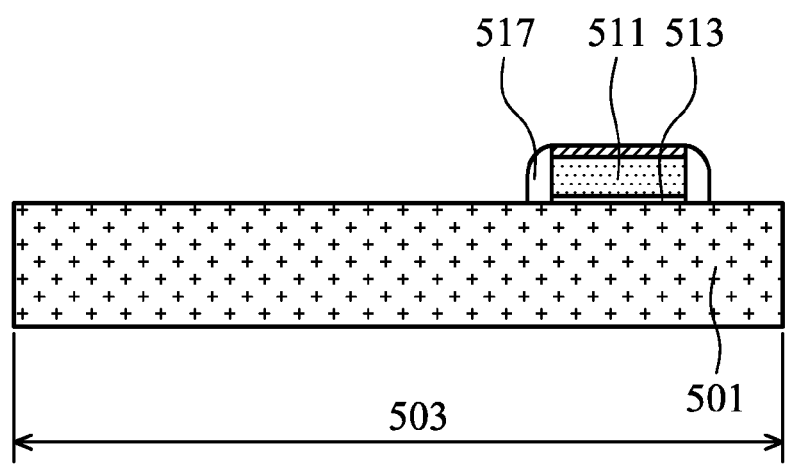
Figure 5C:
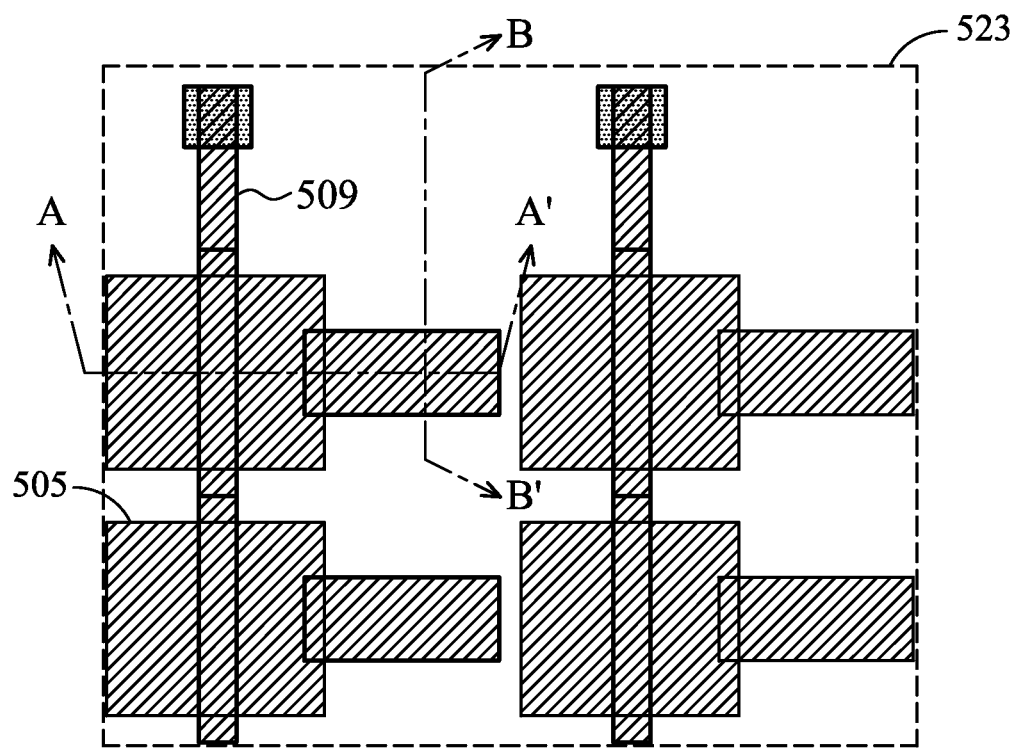
FIG. 5C is a layout diagram of a portion of a memory cell array having partially fabricated memory cells of FIGS. 5A and 5B according to various embodiments of the present disclosure.

FIGS. 5A, 5B, and 5C show a partially fabricated memory cell in cross-sectional diagrams and an overlay diagram after operations 401 to 407. FIG. 5A is a cross-section corresponding to the sectional lines A-A' of FIG. 5C. FIG. 5B is a cross-section corresponding to the sectional lines B-B' of FIG. 5C. FIG. 5A shows a substrate 501 having a STI region 503 and active region 505. A transistor gate include gate dielectric 507 and gate material 509 deposited in operations 403 and 405, respectively. A bottom electrode 511 at least partially over the STI region 503 and fully over a gate dielectric 513 is located across a drain region 515 from the transistor gate. The drain region 515 may be aligned to the spacers 517 around the transistor gate and the bottom electrode 511. A source region 519 may be similarly aligned. In some embodiments, LDD regions (not shown) may be formed at least partially under the gate spacers 517. Salicide regions 521 are shown in FIG. 5A over the bottom electrode 511, transistor gate 521, drain region 515, and source region 519.

In the cross section B-B' view of FIG. 5B, a substrate 501 having only an STI portion 501 is shown under a bottom electrode 511. A gate dielectric 513 is disposed between the bottom electrode 511 and the substrate 501. Spacer 517 surrounds the sides of bottom electrode 511 as shown in FIGS. 5A and 5B.

FIG. 5C is an overlay diagram of a portion 523 of a memory cell array, for example, the memory cell array 300 of FIG. 3. FIG. 5C shows the cut lines A-A' and B-B' corresponding to the cross sectional views of FIGS. 5A and 5B. These same cut lines are used in subsequent cross section figures to show the memory cell in various stages of fabrication.

Referring back to FIG. 4, in operation 409, various regions of the semiconductor substrate adjacent to the transistor gate is implanted to define various implanted regions. The various implanted regions include a source region and a drain region and may also include lightly-doped regions such as lightly-doped drains (LDD) and highly doped regions. The various implanted regions may be aligned to the transistor gate and to a spacer around the transistor gate. In some embodiments, an LDD region is implanted around and aligned to the transistor gate. A spacer is then deposited around the transistor gate. Additional implanting forms source regions and drain regions aligning to the spacer. One or more spacers may be used to define implant regions of various sizes. By various the implantation energy and dopant dosage, shallow or deep implant regions with high doping or light doping are formed. In one example, a highly doped region that is very shallow is formed close to the wafer surface at a top portion of the source region and drain region. By aligning the implantation using various features such as the transistor gate and spacers, no photomask is used in operation 409.

In optional operation 411, a salicide is formed on at least the source region and the drain region. A salicide is a self-aligned silicide formed by reacting a thin metal film with silicon, annealing and/or etching processes. The salicide process begins with deposition of a thin transition metal layer over fully formed and patterned semiconductor devices (e.g. transistors). The wafer is heated, allowing the transition metal to react with exposed silicon in the active regions of the semiconductor device (e.g., source, drain, gate) forming a low-resistance transition metal silicide. The transition metal does not react with the silicon dioxide nor the silicon nitride insulators present on the wafer. Following the reaction, any remaining transition metal is removed by chemical etching, leaving silicide contacts in only the active regions of the device.

In optional operation 413, the gate material in the transistor gate is removed and replaced with one or more different gate materials. Optional operation 413 is used with transistors formed using a "gate last" manufacturing and is discussed in detail in association with FIGS. 10A to 10E and 11A to 11E that depict the "gate last" process aspects of the present disclosure. If the gate material is replaced in operation 413, the salicide is formed on the source region and the drain region which remains silicon and not on the transistor gate. If the gate material is not replaced in operation 413, the salicide is formed on the gate, the source region and the drain region.

Referring back to FIG. 4, in operation 415, a first dielectric material layer is deposited. The first dielectric material layer is the resistive material layer of the RRAM. In some embodiments, the first dielectric material layer is a metal oxide, which may be hafnium oxide, zirconium oxide, aluminum oxide, nickel oxide, tantalum oxide, titanium oxide, and other known oxides used as a resistive material layer. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

The first dielectric material layer may be formed by a suitable technique, such as ALD with a precursor containing a metal and oxygen. Other chemical vapor deposition (CVD) techniques may be used. In another example, the first dielectric material layer may be formed by PVD, such as a sputtering process with a metallic target and with a gas supply of oxygen and optionally nitrogen to the PVD chamber. In yet another example, the first dielectric material layer may be formed by an electron-beam deposition process. The first dielectric material layer may have a thickness ranging between about 20 angstrom and about 200 angstrom.

In operation 417, a top electrode is deposited on the first dielectric material layer. The top electrode may be metal, metal-nitride, doped polysilicon or other suitable conductive material. For example, the top electrode may be tantalum nitride, titanium nitride, and platinum. The top electrode may be formed by PVD, CVD including ALD, or other suitable technique and has a thickness ranging between about 100 angstrom and about 2000 angstroms. Alternatively, the top electrode includes other suitable conductive material to electrically connect the device to other portion of an interconnect structure for electrical routing.

Figure 6A:
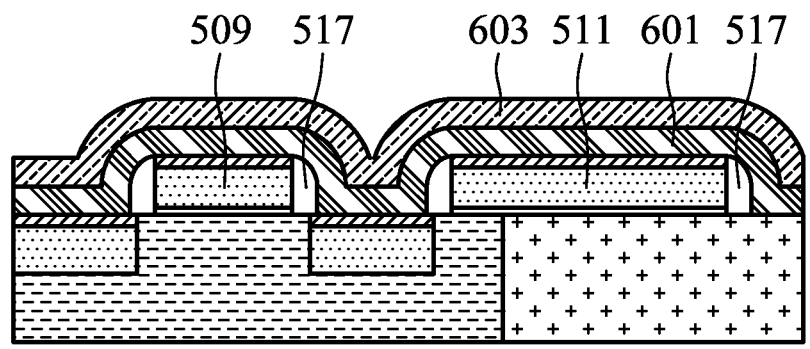
Figure 6B:
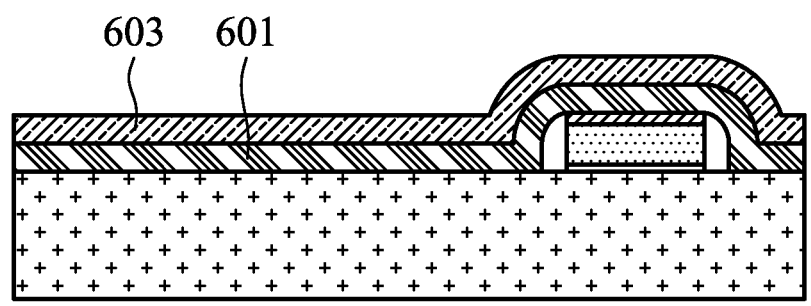

FIGS. 6A and 6B show a partially fabricated memory cell in cross-sectional diagrams and an overlay diagram after operations 415 and 417. FIG. 6A is a cross-section corresponding to the sectional lines A-A' of FIG. 5C. FIG. 6B is a cross-section corresponding to the sectional lines B-B' of FIG. 5C. FIGS. 6A and 6B shows the first dielectric material layer 601 deposited conformally over the transistor gate 509 and spacers 517 and over the bottom electrode 511 and spacers 517. The top electrode material 603 is also deposited conformally, over the first dielectric material layer 601.

Figure 7A:
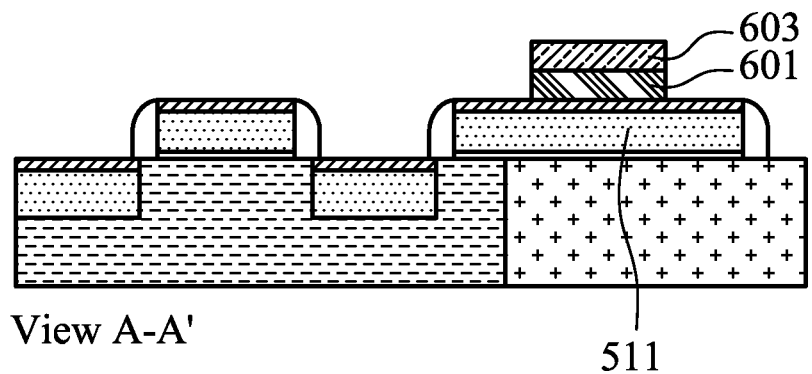
Figure 7B:
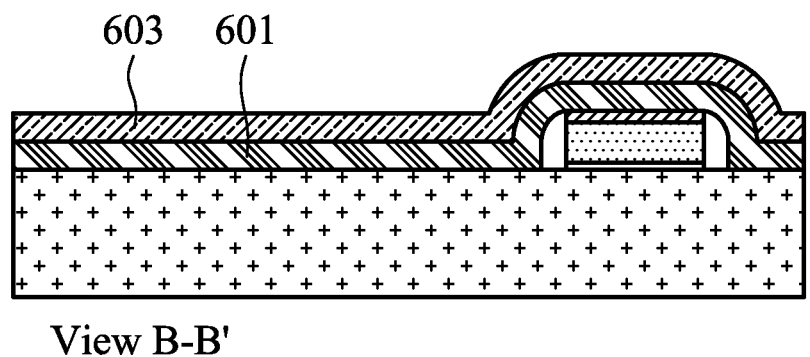
Figure 7C:
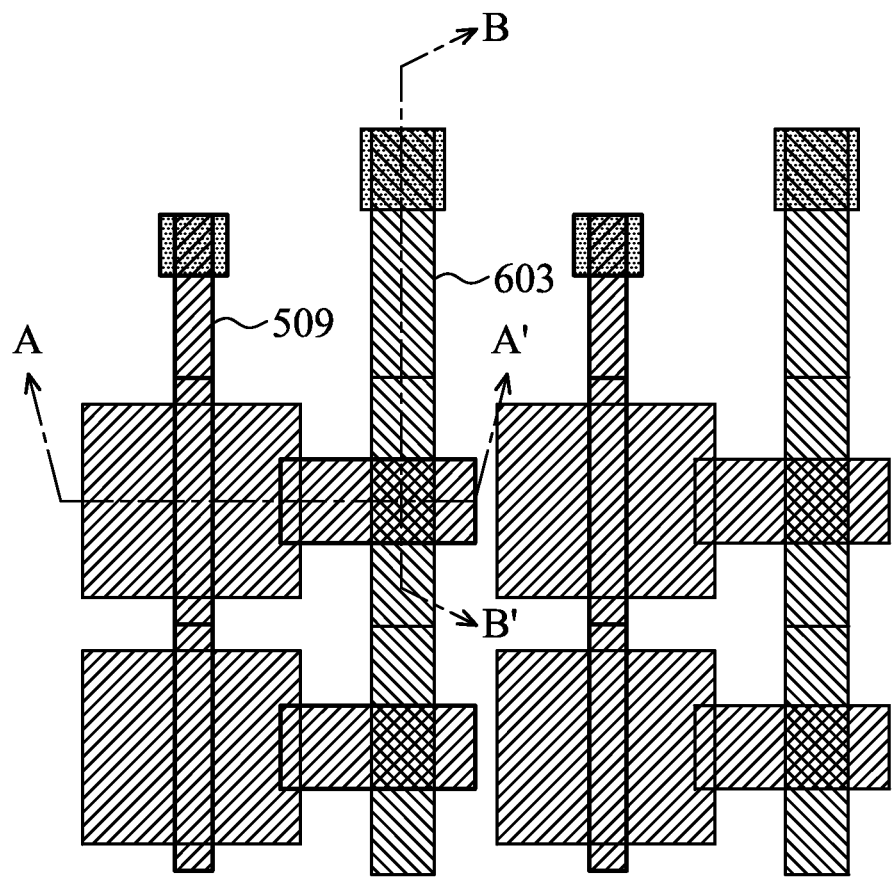
FIG. 7C is a layout diagram of a portion of a memory cell array having partially fabricated memory cells of FIGS. 7A and 7B according to various embodiments of the present disclosure.

Referring back to FIG. 4, in operation 419, the first dielectric material layer and the top electrode material are patterned and each into a RRAM structure. The patterning includes a photolithography operation where a photoresist is deposited, a pattern is defined by exposing photoresist, and developing the photoresist to create a photoresist pattern. The photoresist pattern is then used as an etch mask to protect desired portions of the RRAM structure. The photomask used in this operation is the only one not used in a traditional CMOS fabrication process. Photomasks used in other operations are already included as an operation in traditional CMOS fabrication processes; thus, the embedded RRAM of the present disclosure may be made with only one additional photomask as compared to traditional CMOS fabrication processes and at least two fewer photomasks as compared to other RRAM fabrication processes where the RRAM stack is formed over the transistor. As shown in FIG. 7A in the View A-A', the first dielectric material 601 and the top electrode material 603 are removed from the active region and partially removed from the bottom electrode 511. In the cross section of FIG. 7B of View B-B', the first dielectric material 601 and the top electrode material 603 are not removed. As shown in FIG. 7C, a strip of the first dielectric material 601 and the top electrode material 603 is thus formed across a number of bottom electrodes parallel to the transistor gate structure 509.

Figure 8A:
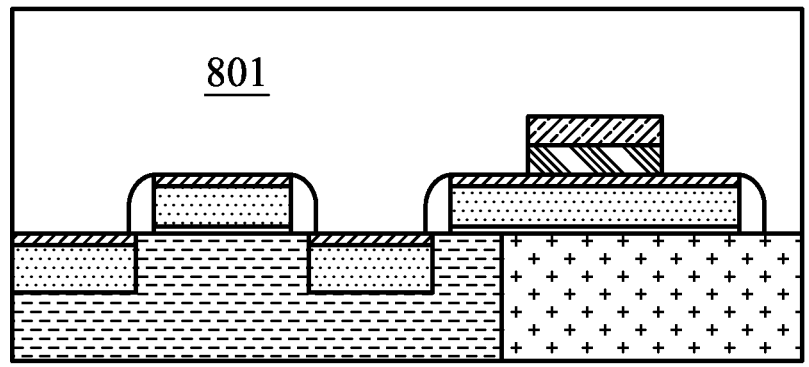
Figure 8B:
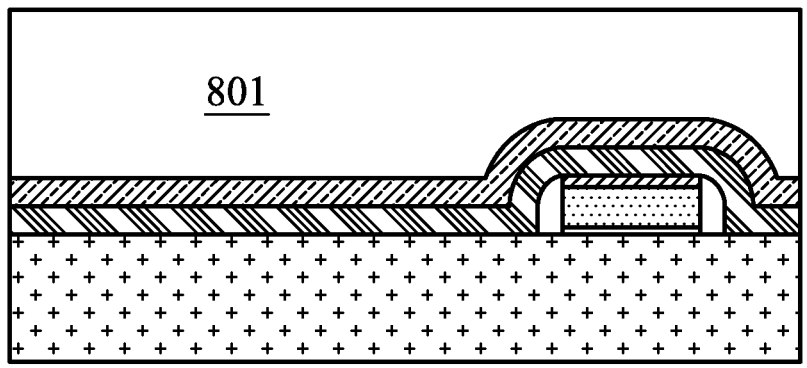

Referring back to FIG. 4, in operation 421 an interlayer dielectric (ILD) is deposited over the wafer. FIG. 8A is a cross-section corresponding to the sectional lines A-A' of FIG. 7C. FIG. 8B is a cross-section corresponding to the sectional lines B-B' of FIG. 7C. FIGS. 8A and 8B show the ILD 801 over the transistor and RRAM. The ILD may be silicon oxide, silicon nitride, silicon oxynitride, carbon doped silicon oxide or nitride, oxygen doped silicon carbide deposited using a CVD technique.

Figure 9A:
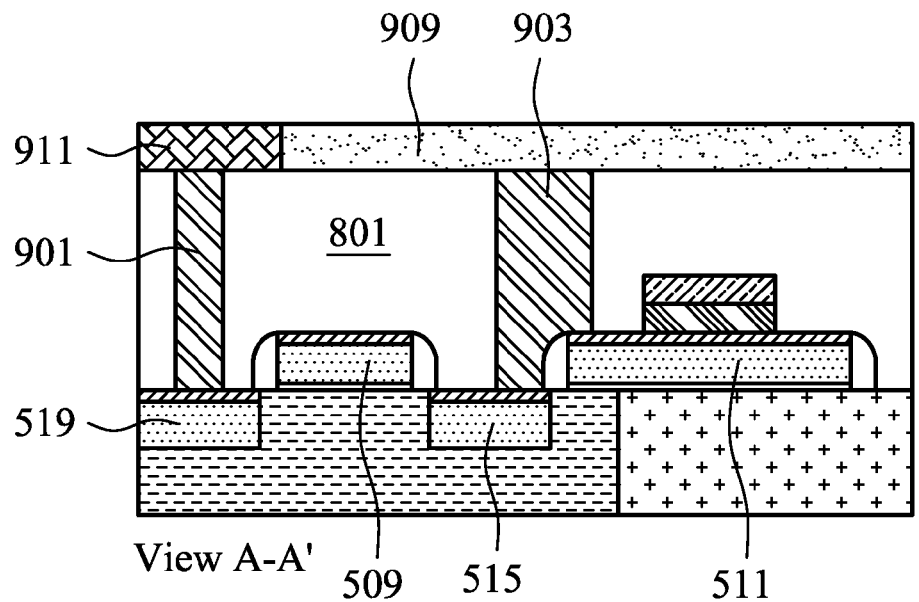
Figure 9B:
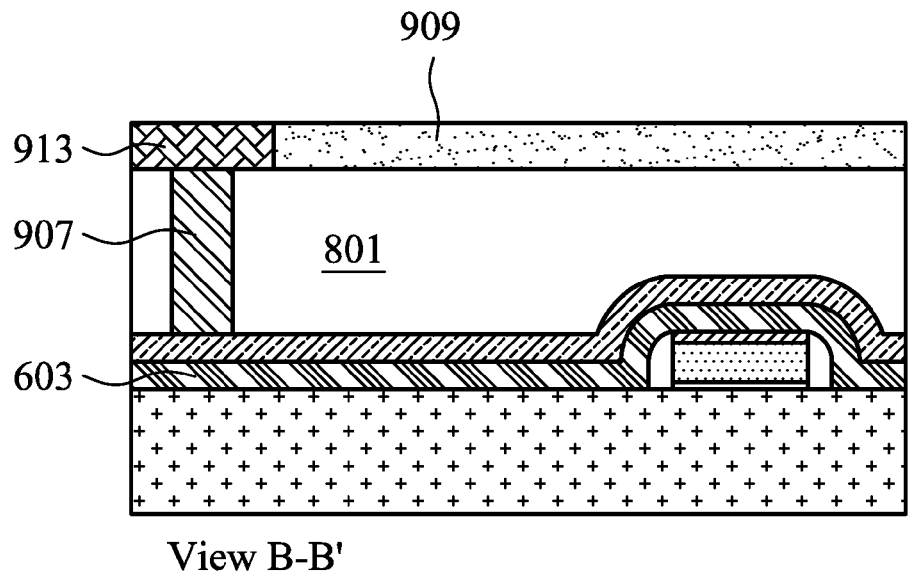
Figure 9C:
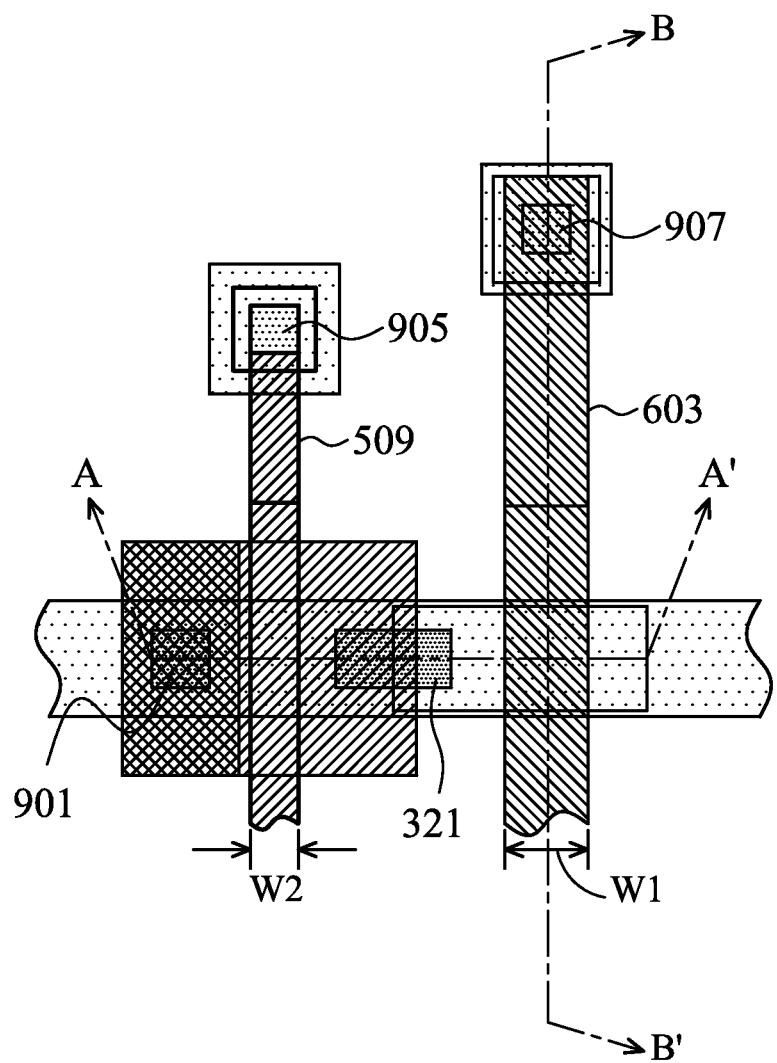
FIG. 9C is a layout diagram of a portion of a memory cell array having partially fabricated memory cells of FIGS. 9A and 9B according to various embodiments of the present disclosure.

Then in operation 423, a bit line contact and a stretch contact are formed in the memory cell. In operation 425, source line contacts and word line contacts are formed in the memory cell array. In some embodiments, operation 423 and operation 425 are performed at the same time. FIG. 9C shows the layout of the bit line contact 901 and stretch contact 903 in the memory cell and the word line contact 905 and the source line contact 907 for the memory cell array. FIG. 9A includes the bit line contact 901 and stretch contact 903. The bit line contact 901 contacts the source region 519 of the transistor. The stretch contact electrically connects the bottom electrode 511 to the drain region 515. The stretch contact is separated from other portions of the RRAM stack by the ILD 801. In FIG. 9B, the source line contact 907 is shown above the top electrode 603. The word line contact 905 of FIG. 9C is not shown in either cross sectional diagrams FIG. 9A and FIG. 9B. The contacts are formed by patterning openings in a photoresist, etching contact holes into the ILD 801, and filling the contact holes with one or more contact material. In some embodiments, one photomask is used for operations 423 and 425 to form all the contact holes for contacts 901, 903, 905, and 907 in the ILD 801.

After operations 423 and 425, metal layers and additional interconnect are formed over the memory cell array. For example, a dielectric layer 909 is deposited over the ILD 801 and contacts 901, 903, 905, and 907. Trenches are formed in the dielectric layer 909 and filled to form bit line 911, source line 913, and word line (not shown).

FIG. 9C shows a portion of the RRAM memory cell array. As discussed, the top electrode 603 and the transistor gate 509 are parallel to each other. The top electrode 603 has a width W1; the transistor gate 509 has a width W2; and the bottom electrode 511 has a width W3. According to various embodiments, the bottom electrode width W3 is greater than the top electrode width W1 in order to have sufficient space for the stretch contact 903 to electrically connect to the bottom electrode 511 without contacting the top electrode or resistive material layer. In some embodiments, width W3 is at least 50% greater than width W2 and may be 2 or 3 times greater. In some embodiments, the top electrode width W1 is about the same as the transistor gate width W2. The various widths are minimized while meeting design rules to maximize use of silicon real estate. Thus, the top electrode and the resistive material layer may not be centered on the bottom electrode as shown in FIG. 9A. In some embodiments, the distal edges of the top electrode, resistive material layer, and the bottom electrode from the transistor are aligned.

In alternate embodiments, the transistor is formed using a "gate last" process. In the "gate last" process, a temporary polysilicon gate is used for the transistor fabrication and removed. The metal gate is then deposited. The gate material in the bottom electrode may not be replaced. FIGS. 10A-10E and 11A-11E shows the cross sections of a memory cell and array where the transistor is formed using a "gate last" process. FIGS. 10A-10E and 11A-11E are discussed in association with various operations of method 400 of FIG. 4, but only differences from the "gate first" process referenced in FIGS. 5A to 9C are discussed in detail. FIGS. 10A-10E are cross sectional diagrams corresponding to view A-A' from various overlay diagrams and FIGS. 11A-11E are cross sections corresponding to view B-B' from various overlay diagrams.

Figure 10A:
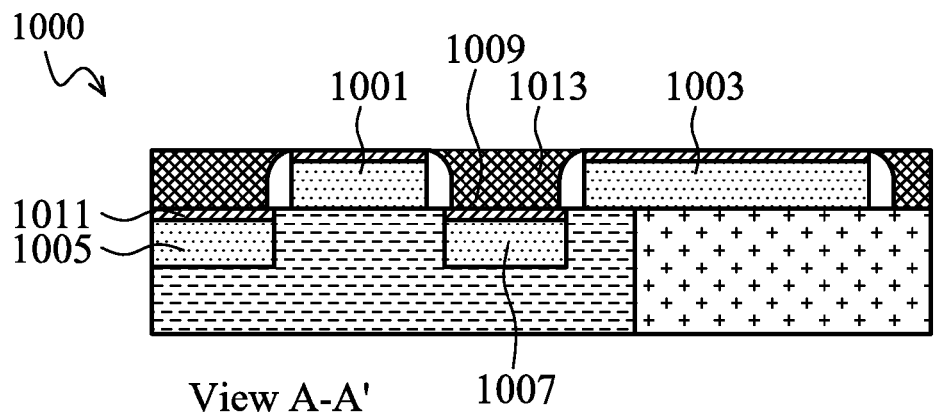
FIGS. 10A to 10E and 11A to 11E are cross sectional diagrams of a partially fabricated memory cell in accordance with various embodiments of the present disclosure.
Figure 11A:
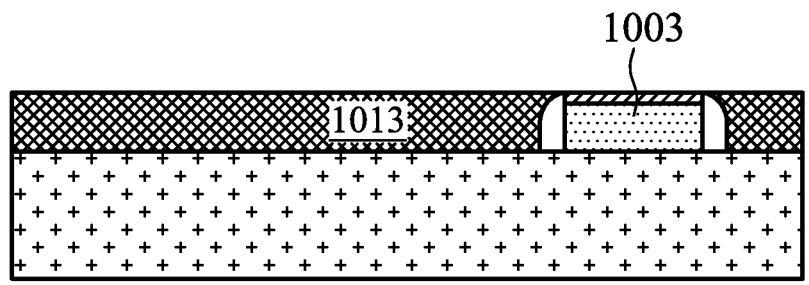

FIG. 10A shows the "gate last" memory cell 1000 from view A-A' after operations 401, 403, 405, 407, 409, 411, and 413. The operations may be performed in different order. In some embodiments, an ILD is deposited before operation 413 of replacing the gate material. In FIG. 10A, the gate material has been replaced in the transistor gate 1001 and bottom electrode 1003. Only the source region 1005 and drain region 1007 includes salicides 1011 and 1009, respectively. The salicides over the gate material are removed when the gate material is replaced. A planarized layer of ILD 1013 is disposed between the gate structure and the bottom electrode structure. FIG. 11A shows the "gate last" memory cell 1000 from view B-B' corresponding FIG. 10A. The bottom electrode 1003 is surrounded by coplanar ILD 1013.

Figure 10B:
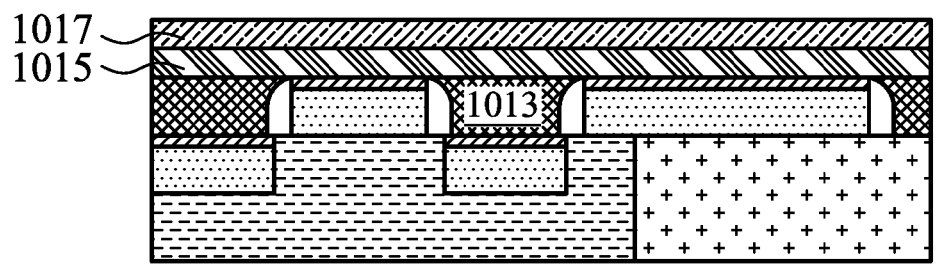
Figure 11B:
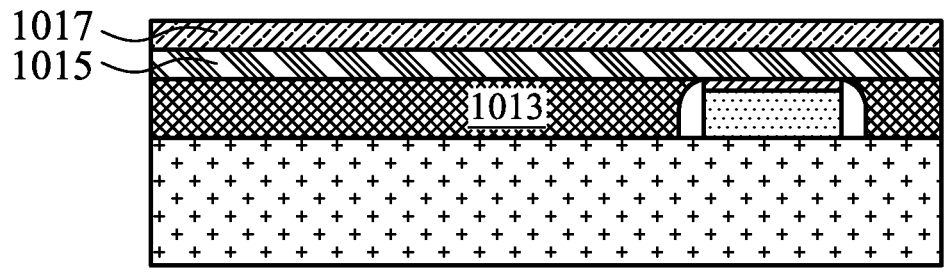

Referring back to FIG. 4, in operations 415 and 417, a first dielectric material layer and a top electrode layer is deposited. FIGS. 10B and 11B shows the first dielectric material layer 1015 and top electrode layer 1017 over the transistor gate, bottom electrode, and the ILD 1013. As opposed to the conformal shape of the first dielectric material layer and the top electrode layer of FIGS. 6A and 6B, here these layers are deposited on already planarized surfaces. As a result, the deposition process window is greater because thickness uniformity is easier to achieve without feature contours to conform.

Figure 10C:
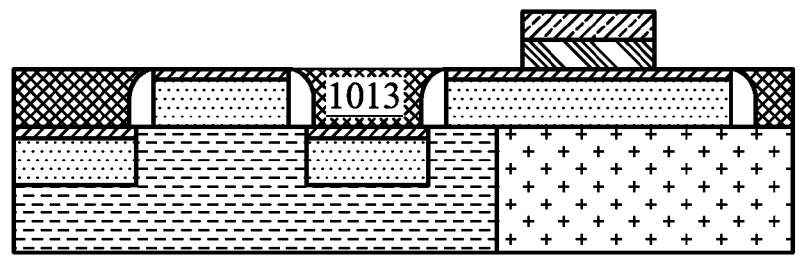
Figure 11C:
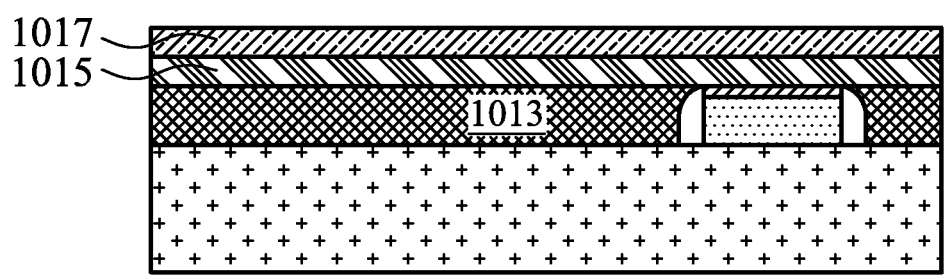

In operation 419, the first dielectric material layer and the top electrode layer is patterned into a RRAM structure. FIGS. 10C and 11C shows the different cross sections of the partially fabricated memory cell after operation 419. FIG. 10C is very similar to FIG. 7A, except for the existence of the ILD layer 1013 between the transistor gate and the bottom electrode and under the first dielectric material layer 1015. FIG. 11C is unchanged from FIG. 11B in the cross section view.

Figure 10D:
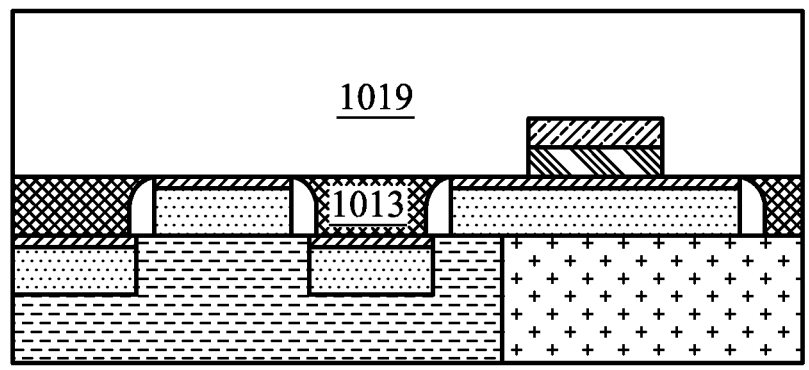
Figure 11D:
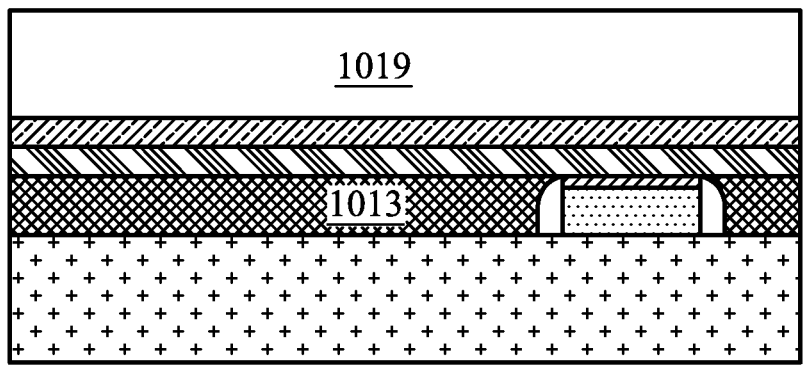

In operation 421, an ILD 1019 is deposited over the RRAM structure, the first ILD 1013, and the transistor gate structure as shown in FIGS. 10D and 11D. The ILD 1019 may be a same material as the first ILD 1013 or a different material.

Figure 10E:
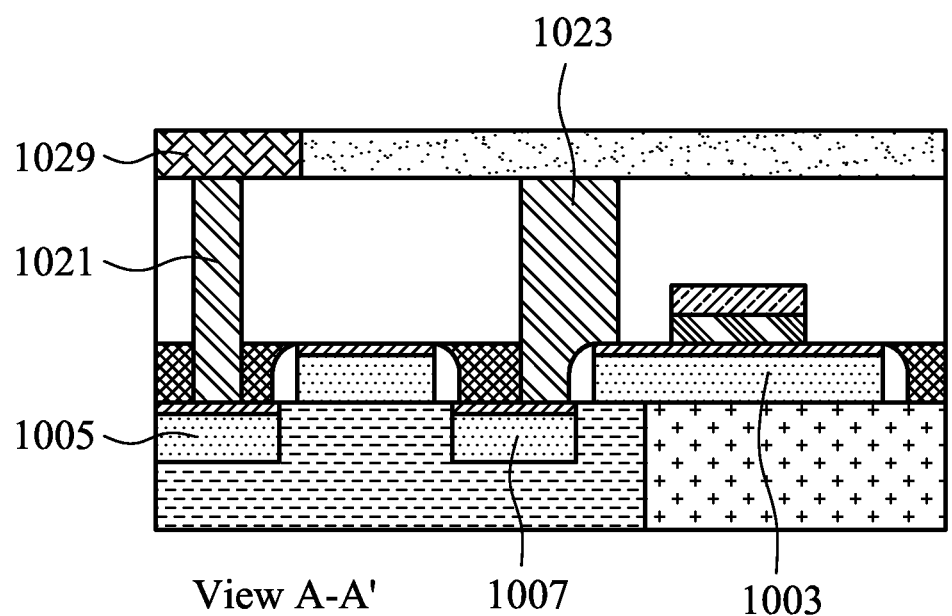
Figure 11E:
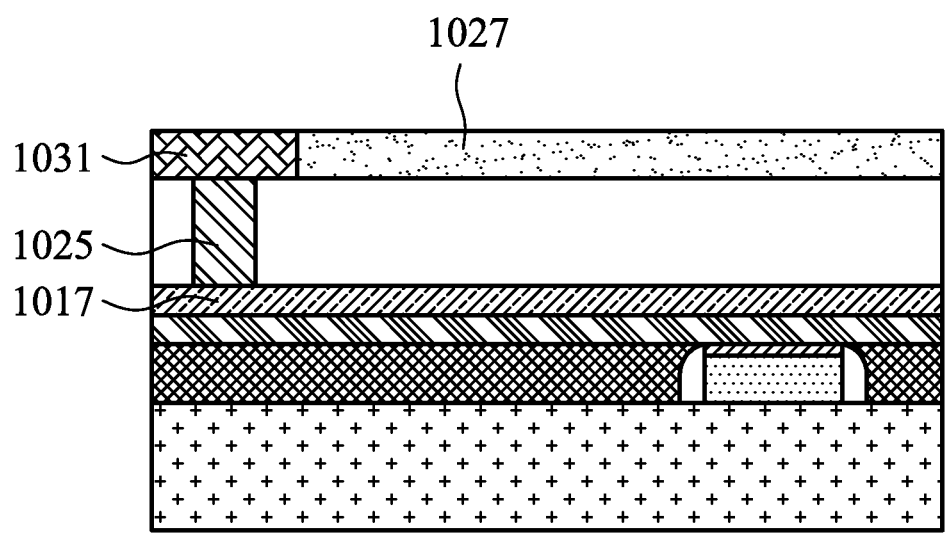

In operations 423 and 425, various contacts are formed through the ILD 1019 to the transistor and the RRAM structure. As shown in FIGS. 10E and 11E, a bit line contact 1021 is formed to the source region 1005, a stretch contact 1023 is formed to connect the bottom electrode 1003 and the drain region 1007, and a source line contact 1025 is formed to the top electrode 1017. Additional ILD layer 1027 and metal lines 1029 and 1031 are formed as the first metal layer (M1) over the contacts.

In one aspect, the present disclosure pertains to a RRAM cell. The RRAM cell includes a transistor having a gate, a source, and a drain region; a bottom electrode adjacent to the drain region and coplanar with the gate; a resistive material layer on the bottom electrode; a top electrode on the resistive material layer; and a conductive material connecting the bottom electrode to the drain region.

In another aspect, the present disclosure pertains to a RRAM cell array. The RRAM cell array includes a number of RRAM cells in an arrangement where the RRAM cells are divided into a number of word line sets and the same RRAM cells are again divided into a number of bit line sets. The RRAM cells in a word line set share a word line contact and a source line contact. The RRAM cells in a bit line set share a bit line contact. Each memory cell in a memory cell array may be uniquely addressed using the word line and the bit line.

In yet another aspect, the present disclosure pertains to a method for making a logic device having embedded RRAM cells. The method includes forming shallow trench isolation (STI) regions in a semiconductor substrate, depositing a gate dielectric, depositing a gate material over the gate dielectric, patterning the gate dielectric and the gate material into a transistor gate and a bottom electrode, implanting regions of the semiconductor substrate adjacent to the transistor gate to define various implanted regions, depositing a first dielectric material layer, depositing a top electrode on the first dielectric material layer, patterning the first dielectric material and the top electrode into a RRAM structure, depositing an interlayer dielectric (ILD), and forming a bit line contact through the ILD to the source region and a stretch contact through the ILD to connect the bottom electrode and the drain region. At least a portion of the bottom electrode is disposed over a portion of the STI regions.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a logic device having embedded resistive random access memory (RRAM) cells, the method comprising:
    forming shallow trench isolation (STI) regions in a semiconductor substrate;
    depositing a gate dielectric;
    depositing a gate material over the gate dielectric;
    patterning the gate dielectric and the gate material into a transistor gate and a bottom electrode, wherein at least a portion of the bottom electrode is disposed over a portion of the STI regions;
    forming a source region and a drain region adjacent to the transistor gate;
    depositing a first dielectric material layer;
    depositing a layer of top electrode material on the first dielectric material layer;
    patterning the first dielectric material and the top electrode into a RRAM structure;
    depositing an interlayer dielectric (ILD); and
    forming a bit line contact through the ILD to the source region and a stretch contact through the ILD to connect the bottom electrode and the drain region.

2. The method of claim 1, wherein the transistor gate and the bottom electrode comprise polysilicon.

3. The method of claim 1, further comprising removing the gate material in the transistor gate and depositing one or more different gate materials.

4. The method of claim 1, wherein the various implanted regions include a source region, a drain region, and a lightly-doped region.

5. The method of claim 4, further comprising forming a salicide on at least the source region and the drain region.

6. The method of claim 5, wherein the salicide is formed on the transistor gate and the bottom electrode.

7. The method of claim 1, further comprising depositing a spacer around the transistor gate and the bottom electrode during implanting regions of the semiconductor substrate operation.

8. The method of claim 1, wherein:
    the top electrode comprises tantalum nitride, titanium nitride or platinum.

9. The method of claim 1, further comprising forming a source line contact to the top electrode and a word line contact to the transistor gate.

10. The method of claim 1, wherein the logic device is formed with one more photomask than a logic device without RRAM cells.

11. A method of making a logic device having embedded resistive random access memory (RRAM) cells, the method comprising:
    forming a transistor having a gate, a source region, and a drain region;
    forming a bottom electrode adjacent to the drain region and having an upper surface coplanar with a top surface of the gate;
    depositing a resistive material layer on the bottom electrode;
    forming a top electrode on the resistive material layer; and
    depositing a conductive material connecting the bottom electrode to the drain region.

12. The method of claim 11, wherein the conductive material is a stretch contact having no connections to metal layers above the RRAM cell.

13. The method of claim 12, further comprising:
    forming a bit line contact between the source region and a first metal layer, wherein the bit line contact and the stretch contact comprise a same material and thickness.

14. The method of claim 11, wherein the bottom electrode and the gate comprise a same material and thickness.

15. The method of claim 11, wherein the bottom electrode and the gate comprise polysilicon.

16. The method of claim 11, wherein the bottom electrode and the gate comprise aluminum, titanium, titanium nitride, or tantalum nitride.

17. The method of claim 11, further comprising:
    depositing a gate dielectric between the bottom electrode and an underlying substrate.

18. The method of claim 11, further comprising:
    forming shallow trench isolation (STI) regions in the semiconductor substrate; and
    forming a doped region in the underlying substrate, wherein the bottom electrode overlies the STI regions and the doped region.

19. The method of claim 11, wherein the resistive material layer comprises hafnium oxide, zirconium oxide, aluminum oxide, nickel oxide, tantalum oxide or titanium oxide.

20. A method of making a logic device having embedded resistive random access memory (RRAM) cells, the method comprising:
    forming a transistor having a gate, a source region, and a drain region;
    forming a bottom electrode adjacent to the drain region and coplanar with the gate;
    depositing a resistive material layer on the bottom electrode;
    forming a top electrode on the resistive material layer; and
    depositing a conductive material connecting the bottom electrode to the drain region,
    wherein the gate and the bottom electrode comprise a same material.

* * * * *